United States Patent
Shiu (10) Patent No.: US 8,559,247 B2
(45) Date of Patent: Oct. 15, 2013

(54) DYNAMIC LEVEL SHIFTER FOR INTERFACING SIGNALS REFERENCED TO DIFFERENT POWER SUPPLY DOMAINS

(75) Inventor: Shinye Shiu, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 344 days.

(21) Appl. No.: 13/108,730

(22) Filed: May 16, 2011

(65) Prior Publication Data

US 2012/0294095 A1    Nov. 22, 2012

(51) Int. Cl.
*G11C 7/10* (2006.01)
*H03K 19/0185* (2006.01)

(52) U.S. Cl.
USPC ............ 365/189.11; 365/189.17; 365/189.06; 365/203; 365/226; 365/233.11; 365/233.12; 365/233.1; 326/68; 326/81; 326/80; 327/333

(58) Field of Classification Search
USPC .......... 365/203, 189.17, 189.06, 189.11, 228, 365/226, 233.11, 233.12, 233.1; 326/68, 326/63, 62, 81, 80; 327/333
See application file for complete search history.

(56) References Cited

U.S. PATENT DOCUMENTS

| | | | |
|---|---|---|---|
| 5,821,799 A | 10/1998 | Saripella | |
| 5,852,373 A * | 12/1998 | Chu et al. | 326/98 |
| 6,448,842 B2 * | 9/2002 | Zanuccoli et al. | 327/536 |
| 7,489,178 B2 | 2/2009 | Yeung | |
| 7,602,217 B2 | 10/2009 | Watson | |
| 7,710,796 B2 | 5/2010 | Cottier et al. | |
| 8,169,246 B2 * | 5/2012 | Malik et al. | 327/211 |

* cited by examiner

*Primary Examiner* — Andrew Q Tran
(74) *Attorney, Agent, or Firm* — Lawrence J. Merkel; Erik A. Heter; Meyertons, Hood, Kivlin, Kowert & Goetzel, P.C.

(57) ABSTRACT

A dynamic level shifter is disclosed. In one embodiment, a dynamic level shifter circuit may receive an input signal referenced to a first voltage of a first power domain, and may output a corresponding signal referenced to a second voltage into a second power domain. The dynamic level shifter circuit may include an evaluation node that is precharged during a first phase (e.g., the low portion) of a clock signal. During the second phase (e.g., the high portion) of the clock signal, the evaluation node may be either pulled low or high, depending on the state of the input signal. A corresponding output signal, based on the evaluated level on the evaluation node, may be output into the second power domain.

25 Claims, 5 Drawing Sheets

DYNAMIC LEVEL SHIFTER FOR INTERFACING SIGNALS REFERENCED TO DIFFERENT POWER SUPPLY DOMAINS

BACKGROUND

1. Field of the Invention

This invention relates to electronic circuits, and more particularly, to level shifter circuits.

2. Description of the Related Art

Many modern integrated circuits (ICs) utilize multiple operating voltages. Some circuits can operate better at lower voltages, while others may function better at higher voltages. Accordingly, many ICs may include multiple power domains, each of which includes circuitry that may operate based on an appropriate supply voltage. For example, an IC having multiple power domains may include one or more processor cores that operates at a voltage of 0.8 volts, and may include a memory that operates at 1.2 volts.

Despite the different operating voltages of circuits in different power domains, it may nevertheless remain necessary for such circuits to communicate with each other. For example, the processor cores of the exemplary IC noted above may need to write data to the memory and read data therefrom. Accordingly, such reads and writes may require the transmission of signals across boundaries between two power domains operating at different voltages.

To transfer signals across boundaries of power domains, level shifter circuits may be used. A level shifter may be a static logic circuit that receives signals at a first voltage corresponding to a supply voltage of a first power domain, and outputs signals at a second voltage corresponding to a supply voltage of the second power domain. Level shifters may be used for shifting a voltage up (when the voltage of the second domain is greater than the first) as well as down (when the voltage of the second domain is less than the first).

SUMMARY

A dynamic level shifter is disclosed. In one embodiment, a dynamic level shifter circuit may receive an input signal referenced to a first voltage of a first power domain, and may output a corresponding signal referenced to a second voltage into a second power domain. The dynamic level shifter circuit may include an evaluation node that is precharged during a first phase (e.g., the low portion) of a clock signal. During the second phase (e.g., the high portion) of the clock signal, the evaluation node may be either pulled low or high, depending on the state of the input signal. A corresponding output signal, based on the evaluated level on the evaluation node, may be output into the second power domain.

In one embodiment, an integrated circuit (IC) may include at lease one processor core and a memory, each of which operates at different supply voltages. The memory may incorporate a number of dynamic level shifter circuits coupled to receive signals (e.g., data signals, control signals, address signals) from the processor core. A clock signal referenced to the supply voltage associated with the processor core may be conveyed to a static level shifter. The static level shifter may output a level-shifted version of the clock signal to the memory, the level shifted version of the clock signal being referenced to the supply voltage associated with the memory. The dynamic level shifters may level shift the signals received from the processor core from the supply voltage of the first power domain to the supply voltage of the second power domain.

In one embodiment of the dynamic level shifter circuit, an evaluation circuit may provide a pull-down path from the evaluation node to a return (e.g., ground) node when first and second transistors are activated. The first transistor may be coupled to receive the input signal, while the second transistor is coupled to receive the clock signal. In another embodiment, the evaluation circuit may include a third transistor coupled to receive a delayed version of the clock signal, and thus the pull-down path is activated when the first, second, and third transistors are active.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit

Figure 1:
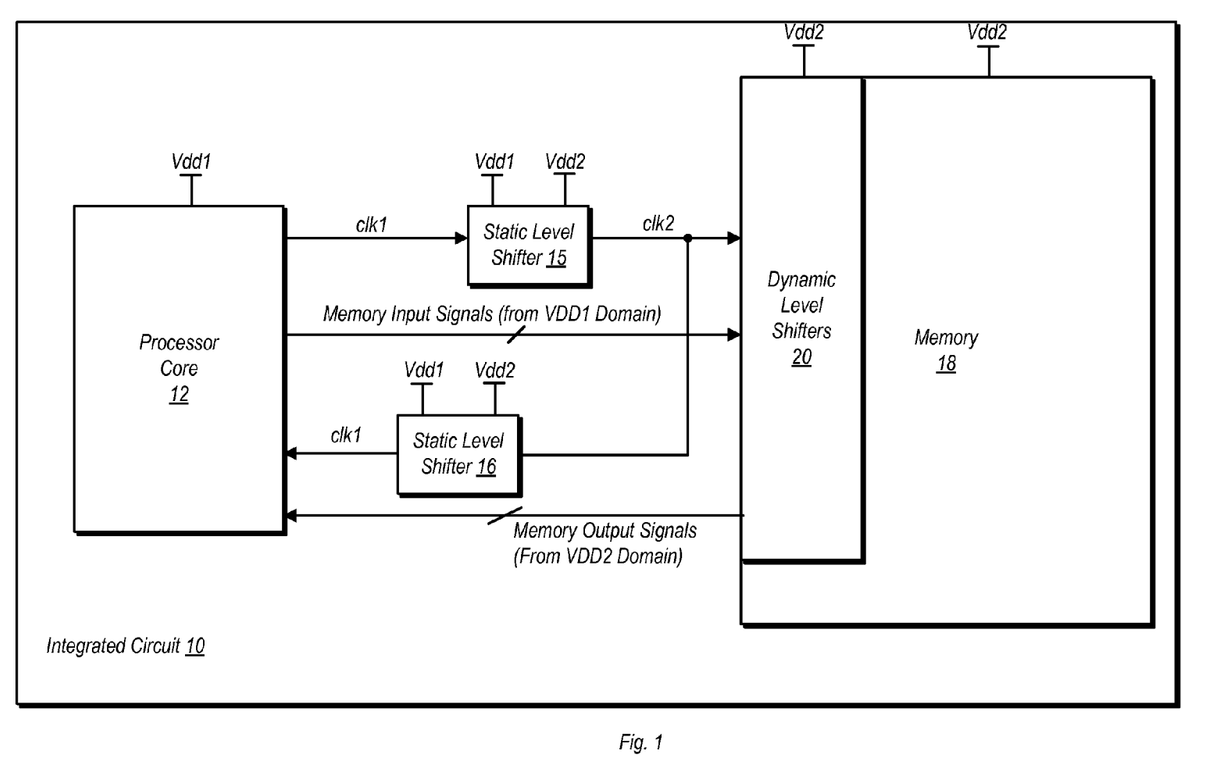
FIG. 1 is a block diagram of one embodiment of an integrated circuit.

Turning now to FIG. 1, a block diagram of one embodiment of an integrated circuit (IC) is shown. IC 10 in the illustrated example includes a processor core 12 and a memory 18. Embodiments having multiple instances of a processor core and/or a memory, as well as other circuitry and functional units not explicitly shown or discussed here, are possible and contemplated.

Processor core 12 in this embodiment is in a first power domain, and thus receives a supply voltage Vdd1. Memory 18 is in a second power domain, and receives a supply voltage Vdd2 that is different from the first supply voltage. In this case, the Vdd2 may be greater than Vdd1, although embodiments where this relationship is reversed are contemplated. Since the voltages of these two functional units are different from one another, level shifters may be utilized in order to enable communications therebetween.

Processor core 18 may perform both reads and writes with respect to memory 18. In order to perform reads and writes, control and address signals may be sent from processor core 12 to memory 18. In addition, for memory writes, data is also sent from processor core 12 to memory 18. In the embodiment shown, memory 18 includes a number of dynamic level shifter circuits 20 coupled to receive signals from processor core 12. An individual dynamic level shifter circuit 20 will be discussed below with reference to FIG. 2, while an alternate embodiment (dynamic level shifter circuit 30 of FIG. 3) is also discussed.

The signals received from processor core 12 by memory 18 may include data, address, and control signals. In addition, memory 18 may also receive a clock signal, clk2, from static level shifter 15. Clk2 may be generated based on a clock signal, clk1, conveyed from processor core 12. Clk1 may be referenced to Vdd1, while clk2 is referenced to Vdd2. Accordingly, static level shifter 15 is operable to perform a level shifting operation on the received clock signal, clk1, in order to produce clk2, which may then be distributed to individual instances of dynamic level shifters 20, which may perform level shifting operations in accordance with the principles of dynamic logic circuitry. The use of dynamic level shifters, in lieu of static level shifters, may allow for faster signal transfers to memory 18. Furthermore, many memories such as memory 18 employ dynamic circuitry, and as such, may be suitable for integration of dynamic level shifters when necessary to communicate across power domain boundaries.

Data that is read from memory 18 may be provided from memory 18 from dynamic level shifters 20 to processor core 12. The clock signal, Clk2, may be provided to static level shifter 16, which is referenced to Vdd2. Static level shifter 16 may output another instance of Clk1. In other embodiments, Clk1 may be fed back directly to dynamic level shifters 20 in processor core 12, in lieu of regenerating it with static level shifter 16 (thereby obviating the need for the second static level shifter). It is also noted that embodiments are possible and contemplated where static level shifters are used in the path by which memory output signals are received by processor core 12 from memory 18. In such embodiment, dynamic level shifters 20 are not required in the memory receive path in processor core 12.

Dynamic Level Shifter Embodiments

Figure 2:
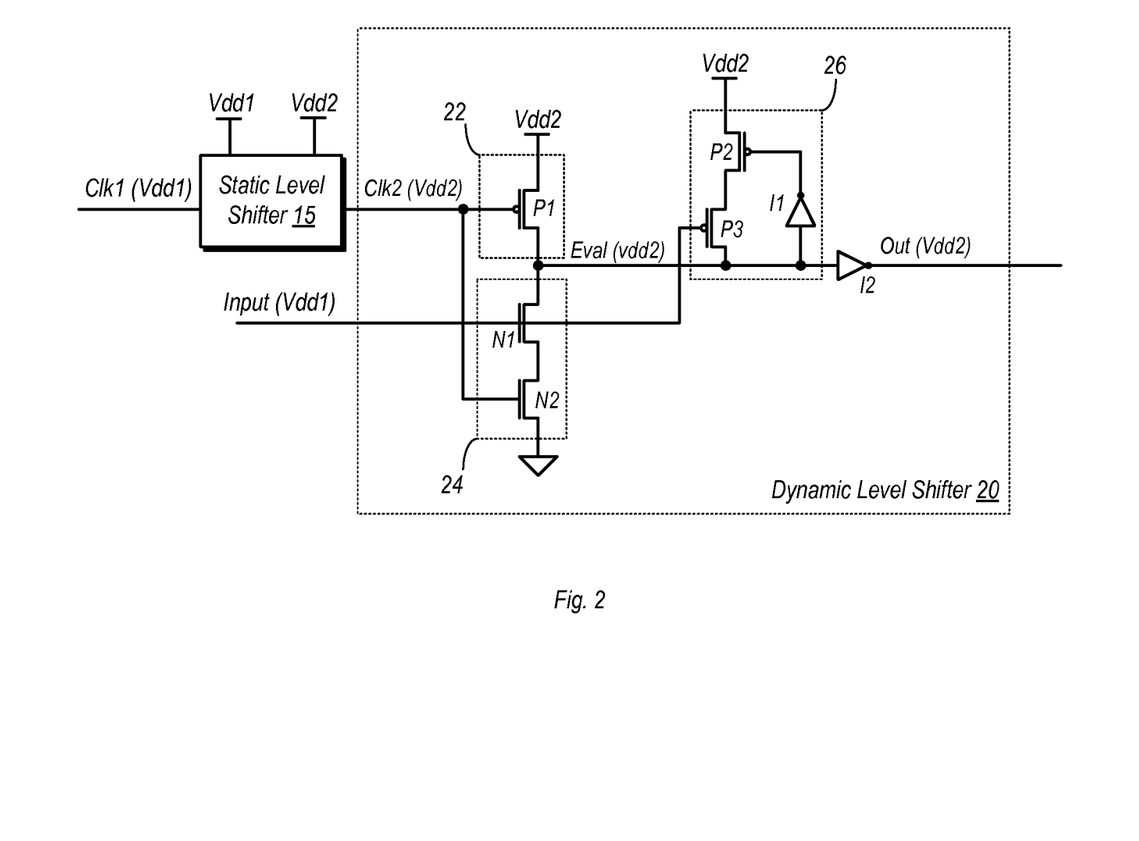
FIG. 2 is a schematic diagram of one embodiment of a dynamic level shifter.

FIG. 2 is a schematic diagram of one embodiment of a dynamic level shifter circuit. In the embodiment shown, dynamic level shifter 20 is configured to receive an input signal referenced to Vdd1 and to provide an output signal referenced to Vdd2. The circuit may operate under the principles of dynamic logic, wherein a first phase of a clock signal is a precharge phase, while a second phase of the clock signal is an evaluation phase. This contrasts with the operation of a static level shifter circuit, wherein the operation is not based on a clock and thus the output follows the input irrespective of any clock signal or phase thereof.

It is noted that in the illustrated embodiment, transistors designated with a 'P' (e.g., P1) are p-channel metal oxide semiconductor (PMOS) transistors. Those transistors designated with an N' in the illustrated embodiment are n-channel metal oxide semiconductor (NMOS) transistors. It is noted however that this arrangement is not intended to be limiting, and thus the particular types of transistors used for a given embodiment may be different from that shown here.

In the embodiment shown, dynamic level shifter 20 includes a precharge circuit 22, a pull-down (or evaluation) circuit 24, and a keeper circuit 26. Dynamic level shifter 20 also includes an inverter 12 coupled between an evaluation node ('Eval') and an output node ('Out'), which are both referenced to Vdd2. Signals may be output by dynamic level shifter 20 at the same logic value as received during an evaluation phase. However, while the output signal is referenced to Vdd2, the input signal is referenced to Vdd1.

Precharge circuit 22 in this embodiment includes transistor P1, which is coupled to receive the clk2 signal. As previously mentioned, the clk2 signal is referenced to Vdd2, and it provided from static level shifter 15. The clk1 signal, referenced to Vdd1, may be provided to static level shifter 15 in order to generate the clk2 signal. Transistor P1 may be activated responsive to receiving clk2 in its low state. When active, transistor P1 provides a pull-up path between the evaluation node and Vdd2, thus performing a precharge operation. The evaluation node may also be referred to as a transfer node via which a signal is transferred from the input node to the output node during the evaluation phase.

Pull-down circuit 24 in this embodiment includes transistors N1 and N2, which are coupled in series between the evaluation node and a reference (e.g., ground) node. The gate terminal of transistor N1 is coupled to an input node and is thus arranged to receive an input signal. An input signal conveyed on the input node is referenced to Vdd1 in this embodiment. Transistor N1 in this embodiment may be activated responsive to receiving the input signal as a logic high voltage, as referenced to Vdd1. Transistor N2 in the embodiment shown is coupled to receive clk2, and may be activated when clk2 is at a logic high voltage, as referenced to Vdd2. Since transistor P1 is active when the clk2 is low and transistor N2 is active when the clk2 is high, the cycle of clk2 may be considered to occur in a precharge phase (clk2 low) and an evaluation phase (clk2 high). When both transistors N1 and N2 are active, a pull-down path exists between the evaluation node and ground. Accordingly, the evaluation node may be evaluated as a logic low when transistors N1 and N2 are active at the same time.

Keeper circuit 26 in the illustrated embodiment includes transistors P2, P3, and inverter I1. Transistor P2 is arranged to receive the output from inverter I1, while the latter is coupled to receive an input from the evaluation node. When the evaluation node is at a logic high, inverter I1 may drive its output to a logic low, thereby causing the activation of P2. When both transistors P2 and P3 are active, the evaluation node is pulled up toward Vdd2.

The gate terminal of transistor P3 in the embodiment shown is coupled to the input node, which as noted above, is referenced to Vdd1. Thus, transistor P3 is activated responsive to the input signal being receiving as a logic low. Since the gate terminals of both transistors P3 and N1 are coupled to receive the input signal on their respective gate terminals, only one of these devices is activated responsive to receiving the input signal at a particular logic level. When the input signal is received as a logic high, transistor N1 is activated while transistor P3 is deactivated. When the input signal is received as a logic low, transistor P3 is activated while transistor N1 is deactivated. Accordingly, contention between keeper circuit 26 and pull-down circuit 24 may be alleviated, since there is no substantial concurrency between their respective activation times.

Figure 3:
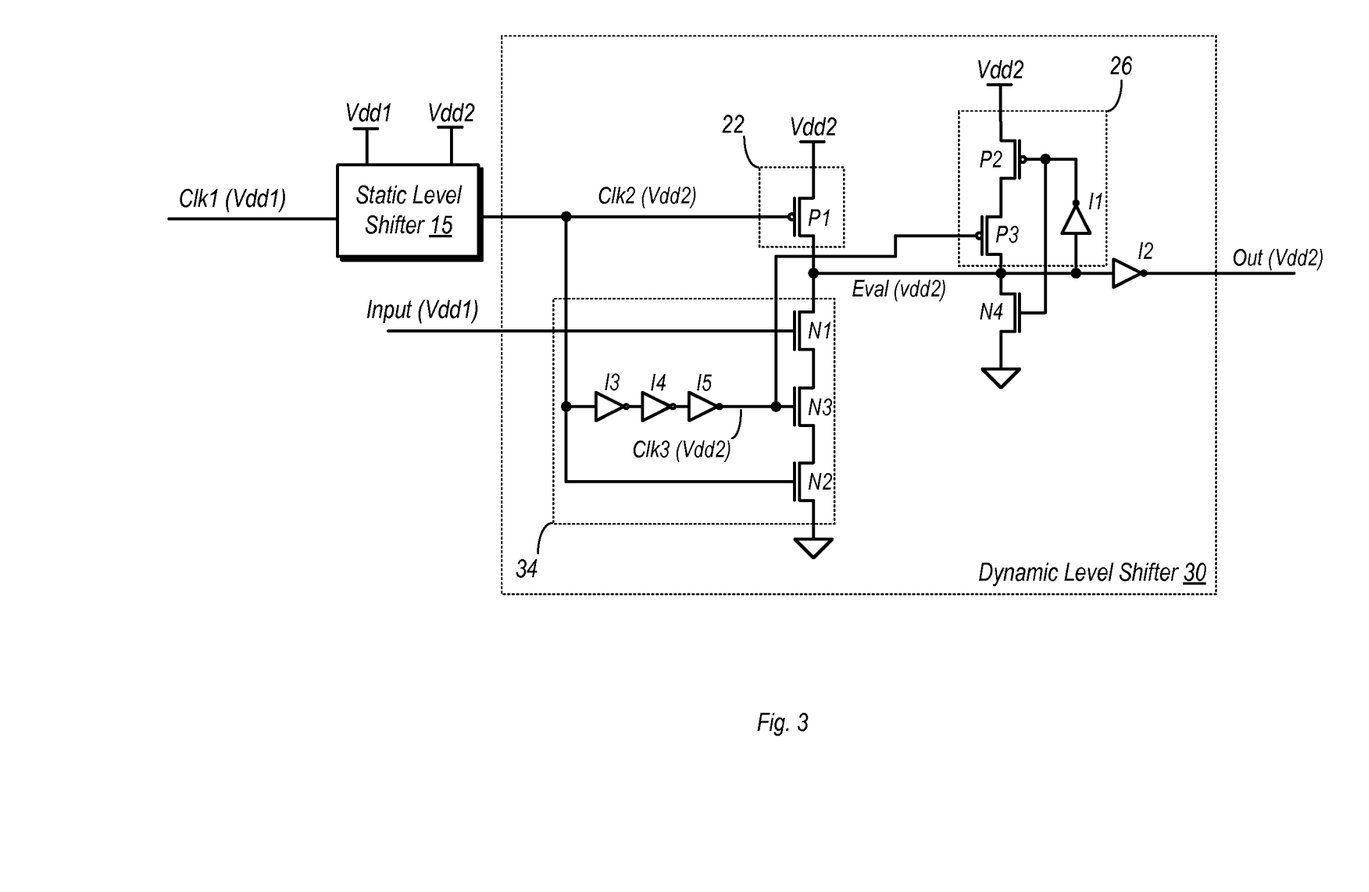
FIG. 3 is a schematic diagram of another embodiment of a dynamic level shifter.

FIG. 3 is another embodiment of a dynamic level shifter. In the embodiment shown, dynamic level shifter 30 includes a precharge circuit 22 a keeper circuit 26, and inverter 12 that are arranged similar to their counterparts in the embodiment shown in FIG. 2. However, pull-down circuit 34 in dynamic level shifter 30 utilizes a different topology than that of dynamic level shifter 20. Additionally, dynamic level shifter 39 includes an additional pull-down transistor, N4, coupled to the evaluation node, while the gate terminal of transistor P3 is coupled to receive a delayed clock signal, rather than the input signal.

Pull-down circuit 34 in the embodiment shown includes three transistors coupled in series between the evaluation node and the return node. Transistor N1 includes a gate terminal coupled to receive the input signal from the power domain of Vdd1. Transistor N2 includes a gate terminal coupled to receive clk2 from static level shifter 15. Transistor N3 is coupled to receive a delayed version of clk2, designated here as clk3. Inverters I3, I4, and I5 are coupled in series between the clk2 node and the gate terminal of N3. The input of inverter I3 is coupled to receive the clk2 signal, while the output of inverter I5 is coupled to provide the clk3 signal. The clk3 signal is provided to respective gate terminals of transistor N3 and P3 in this particular embodiment.

When clk2 falls and the precharge phase is entered, clk3 transitions high after a delay provided by inverters I3-I5. The low-to-high transition of clk3 may cause the activation of transistor N3 and the deactivation of P3. When the evaluation phase is entered, clk2 transitions high, while clk3 remains high due to the delay provide by inverter I3-I5. Thus, upon entry into the evaluation phase, both transistors N2 and N3 are activated, while P3 remains inactive. Accordingly, if a logic high received on the input node causes the activation of transistor N1, the pull-down path provided between the evaluation node and the reference node is activated. Furthermore, since P3 is inactive at this point, there is no contention between the pull-down path and the pull-up path of keeper circuit 26. Thus, the evaluation node may be pulled low at this point. When the evaluation node is pulled low, transistor N4 (which includes a gate terminal coupled to the output of inverter I1) may be activated, thereby providing a second pull-down path from the evaluation node to ground. The pull-down path through transistors N1-N3 may remain active until clk3 falls low, at which time transistor N3 may be deactivated.

If the input signal is low at the beginning of the evaluation phase, transistor N1 remains inactive, and thus the logic high to which the evaluation node was precharged may remain. However, P3 remains inactive at the beginning of the evaluation phase, and thus the evaluation node may momentarily float. After the delay time has elapsed subsequent to entering the evaluation phase, clk3 may fall low, thereby activating P3 and thus enabling the pull-up path between the evaluation node and Vdd2. The pull-up path may remain active through the end of the evaluation phase and into the next precharge phase until clk3 transitions high again.

It is noted that the embodiments shown in FIGS. 2 and 3 are exemplary embodiments of a dynamic level shifter. Other embodiments are possible and contemplated. In general, the disclosure contemplates a circuit that combines level shifting with dynamic circuit operation that is divided into a precharge phase and an evaluation phase according to a clock signal.

Method of Operation for Dynamic Level Shifter

Figure 4:
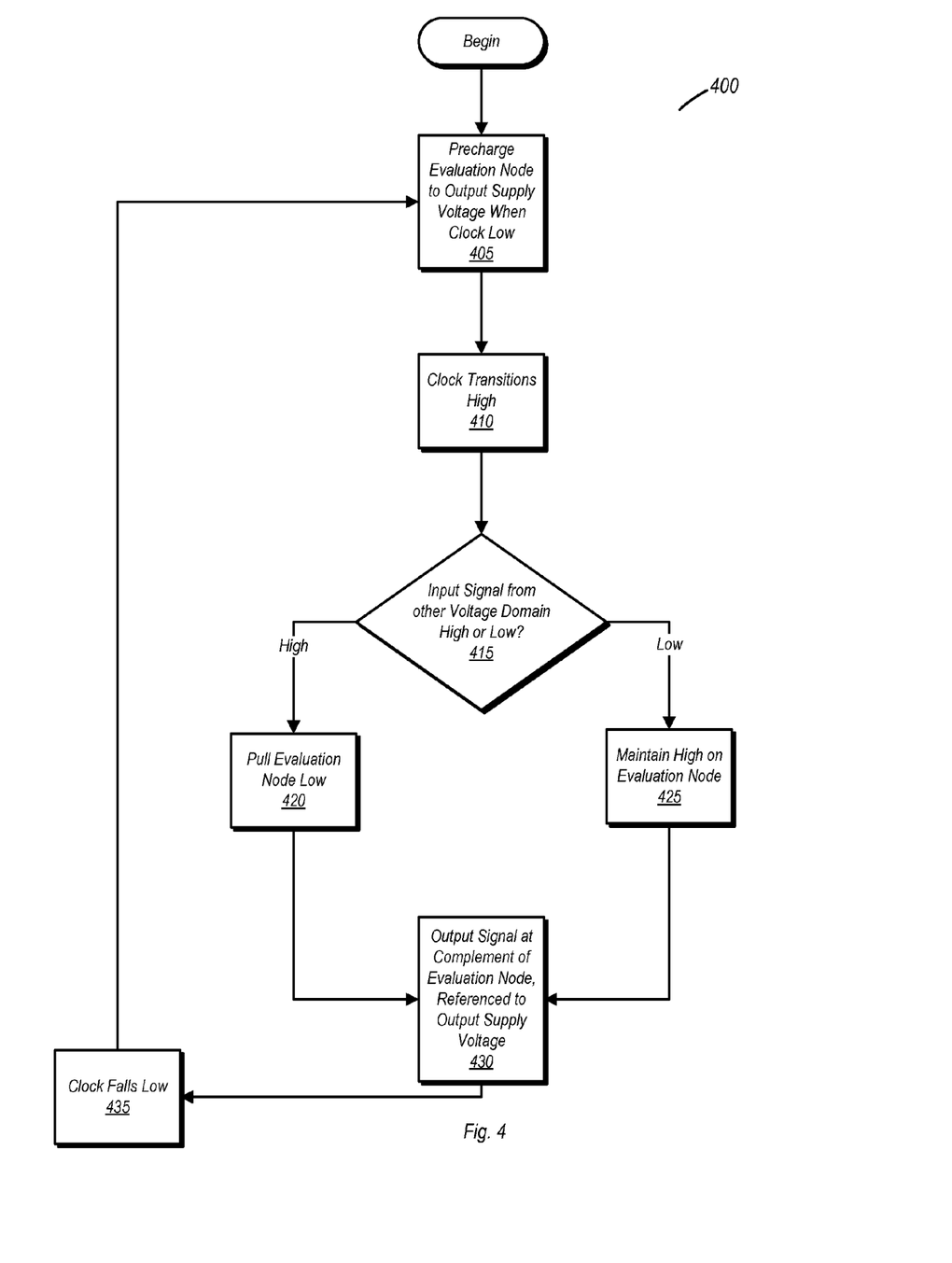
FIG. 4 is a flow diagram illustrating one embodiment of a method for operating a dynamic level shifter.

FIG. 4 is a flow diagram illustrating one embodiment of a method for operating a dynamic level shifter. The method may be utilized with either one of the circuit embodiments discussed above and illustrated in FIGS. 2 and 3, as well as other circuit embodiments not explicitly discussed herein.

Method 400 begins with the precharging of an evaluation node when a clock signal received by the dynamic level shifter is low (block 405). The clock signal may be received on the gate terminal of a PMOS transistor, which may activated to provide a pull-up path between the evaluation node and a supply voltage of the output signal provided by the dynamic level shifter. The output signal and the received clock signal may both be referenced to the output supply voltage.

The precharge phase is exited and the evaluation phase is entered when the clock signal transitions high (block 410). After the clock signal transitions high, an input signal is evaluated. The input signal is received from a different power domain, and is thus referenced to a different supply voltage than the output signal to be provided by the dynamic level shifter. For example, the input signal may be received from circuitry in a power domain that operates at 0.6 volts, while the output signal may be provided to circuitry in a power domain that operates at 1.0 volt.

If the input signal is high (block 415, high), the evaluation node may be pulled low (block 420) by a pull-down circuit, which activates responsive to receiving the high signal during the evaluation phase. If the input signal is low (block 415, low), then the high to which the evaluation node was precharged may be maintained (block 425). In either case, the output signal may be provided as a complement of the level on the evaluation node (block 430) and as an equivalent to the logic level of the input signal. The output signal may be referenced to the same supply voltage toward which the evaluation node was pulled during the precharge phase.

The end of the evaluation phase may be marked by the falling low of the clock signal (block 435). At this point, the method may return to block 405, and a precharge may commence for the next cycle of operation.

Exemplary System

Figure 5:
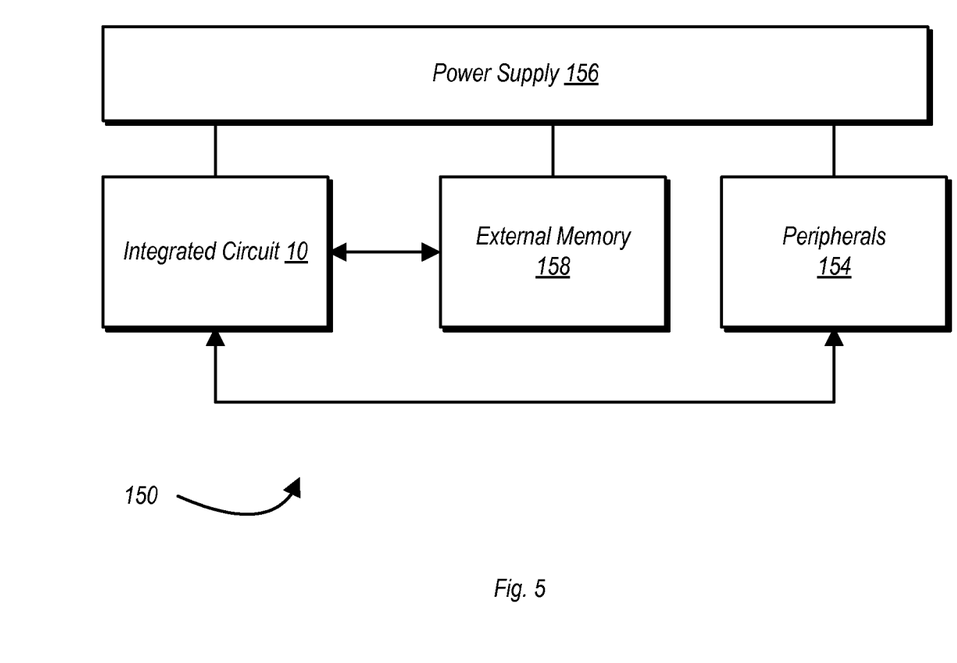
FIG. 5 is a block diagram of one embodiment of a system.

Turning next to FIG. 5, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
  a precharge circuit coupled to receive a clock signal, wherein the precharge circuit is configured to precharge an evaluation node to a first logic level during a first phase of the clock signal;
  a pull-down circuit having an input node coupled to receive an input signal, wherein the pull-down circuit is configured to, during a second phase of the clock signal, provide a pull-down path between the evaluation node and a ground node responsive to receiving the input signal at the first logic level; and
  a keeper circuit, wherein the keeper circuit is configured to, during the second phase of the clock signal, hold the evaluation node at the first logic level responsive to the input node receiving the input signal at a second logic level;
  wherein the first logic level, on the input node, is referenced to a first supply voltage, and wherein the first logic level, on the evaluation node, is referenced to a second supply voltage.

2. The circuit as recited in claim 1, wherein the precharge circuit is coupled to receive the clock signal from an output of a static level shifter circuit, wherein the clock signal is referenced to the second supply voltage.

3. The circuit as recited in claim 1, wherein the pull-down circuit includes:
  first and second transistors coupled in series between the evaluation node and the ground node, wherein the first transistor includes a first gate terminal coupled to the input node, and wherein the second transistor includes a second gate terminal coupled to receive the clock signal;
  wherein the keeper circuit includes:
  third and fourth transistors, wherein the third transistor is coupled between a supply voltage node coupled to receive the second supply voltage and the fourth transistor, and wherein the fourth transistor is coupled between the third transistor and the evaluation node, wherein a gate terminal of the fourth transistor is coupled to the input node; and
  an inverter having an input coupled to the evaluation node and an output coupled to a gate terminal of the third transistor.

4. The circuit as recited in claim 3, wherein the pull-down circuit is configured to activate the pull-down path responsive to activation of both the first and second transistors, wherein the first transistor is configured to be activated responsive to receiving, on its gate terminal, the input signal at the first logic level, and wherein the second transistor is configured to be activated responsive to the clock transitioning from the first phase to the second phase.

5. The circuit as recited in claim 1, wherein the pull-down circuit includes:
  first, second, and third transistors coupled in series between the evaluation node and the ground node, wherein each of the first, second, and third transistors includes a respective gate terminal, wherein the first transistor is configured to be activated responsive to receiving the input signal at the first logic level on its gate terminal, wherein the second transistor is configured to be activated responsive to the clock signal transitioning to the second phase, and wherein the third transistor is configured to be activated at a delay time subsequent to the clock signal transitioning to the second phase;
  wherein the keeper circuit includes:
  fourth and fifth transistors, wherein the fourth transistor is coupled between a supply voltage node coupled to receive the second supply voltage and the fifth transistor, and wherein the fifth transistor is coupled between the fourth transistor and the evaluation node, wherein the fifth transistor is configured to be activated at the delay time subsequent to the clock signal transitioning to the second phase;
  an inverter having an input coupled to the evaluation node and an output coupled to a gate terminal of the fourth transistor, wherein the fifth transistor is configured to be activated responsive the inverter driving the gate terminal of the fourth transistor to the second logic level; and
  a sixth transistor coupled between the evaluation node and the ground node, the sixth transistor having a gate terminal coupled to the output of the inverter, wherein the sixth transistor is configured to be activated responsive to the inverter driving the gate terminal of the sixth transistor to the first logic level.

6. A level shifter comprising:
  an evaluation node;
  an inverter having an input coupled to the evaluation node;
  a first transistor having a gate terminal coupled to an output of the inverter, a source terminal coupled to a first power supply voltage having a first magnitude during use, and a drain terminal;
  a second transistor having a source terminal coupled to the drain terminal of the first transistor, and a drain terminal coupled to the evaluation node;
  a precharge transistor having a source terminal coupled to the first power supply voltage, a drain terminal coupled to the evaluation node, and a gate terminal coupled to receive a clock signal, wherein the precharge transistor is configured to precharge the evaluation node to a first logic level during a first phase of the clock signal; and
  an evaluation circuit coupled between the evaluation node and a ground node, wherein the evaluation circuit is configured to drive the evaluation node to a second logic level if activated during the second phase of the clock signal, wherein the evaluation circuit is coupled to an input node coupled to receive an input referenced to a second power supply voltage having a second magnitude during use, the second magnitude different from the first magnitude.

7. The level shifter as recited in claim 6, wherein the evaluation circuit further includes a third transistor having a gate terminal coupled to the input node, and a fourth transistor having a gate terminal coupled to receive the clock signal, wherein the third transistor is coupled to the evaluation node, and the fourth transistor is coupled to the ground node.

8. The level shifter as recited in claim 7, wherein the third transistor is further coupled to the fourth transistor, wherein the evaluation circuit is configured to provide a pull-down path between the evaluation node and the ground node when the third and fourth transistors are both active, wherein the third transistor is configured to be activated responsive to receiving a signal at a first logic level on the input node, and wherein the fourth transistor is configured to be active responsive to the clock signal transitioning to the second phase; and wherein a gate terminal of the second transistor is coupled to the input node, wherein the second transistor is configured to be activated responsive to receiving the signal at a second logic level on the input node, and wherein the first transistor is configured to be activated responsive to the inverter driving its gate terminal to the second logic level.

9. The level shifter as recited in claim 7, wherein the evaluation circuit further includes a fifth transistor having a gate terminal coupled to receive a delayed version of the clock signal, and wherein a gate terminal of the second transistor is coupled to receive the delayed version of the clock signal, wherein the evaluation circuit is configured to provide a pull-down path between the evaluation node and the ground node responsive to activation of the third, fourth and fifth transistors;

wherein the third transistor is configured to be activated responsive to receiving a signal at the first logic level on the input node;

wherein the fourth transistor is configured to be activated responsive to receiving the clock signal at the first logic level; and wherein the fifth transistor is configured to be activated responsive to receiving the delayed clock signal at the first logic level.

10. The level shifter as recited in claim 6, further comprising a third transistor having a gate terminal coupled to the output of the inverter, wherein the third transistor is coupled between the evaluation node and the ground node.

11. An integrated circuit comprising:
a processor core coupled to receive a first supply voltage;
a memory coupled to receive a second supply voltage; and
a static level shifter coupled to receive an input clock signal conveyed by the core, wherein the input clock signal is referenced to the first supply voltage, and wherein the static level shifter is configured to provide an output clock signal to the memory, wherein the output clock signal is referenced to the second supply voltage;
wherein the memory includes a plurality of dynamic level shifter circuits each coupled to receive a corresponding signal from the processor core, wherein each of the dynamic level shifter circuits includes:
a transfer node;
a precharge circuit coupled to receive the output clock signal and configured to precharge the transfer node when the output clock signal is at a logic low level;
an evaluation circuit having an input node coupled to receive a corresponding one of a plurality of input signals from the processor core, wherein the evaluation circuit is configured to, when active, provide a pull-down path between the transfer node and a ground node;
a keeper circuit coupled between the evaluation node and the second supply voltage node, wherein the keeper circuit is configured to, when active, provide a keeper path between the transfer node and the second supply voltage node;
wherein the input signal is referenced to the first supply voltage, and wherein a signal on the transfer node is referenced to the second supply voltage.

12. The integrated circuit as recited in claim 11, wherein the evaluation circuit of each dynamic level shifter circuit includes a first transistor having a first gate terminal coupled to receive the corresponding one of the plurality of input signals and a second transistor having a second gate terminal coupled to receive the output clock signal, wherein the first transistor is configured to be activated responsive to the receiving the corresponding one of the plurality of input signals as a logic high and wherein the second transistor is configured to be activated responsive to receiving the output clock signal as a logic high.

13. The integrated circuit as recited in claim 12, wherein the keeper circuit of each dynamic level shifter circuit includes:
an inverter having an input coupled to the transfer node;
a third transistor having a gate terminal coupled to an output of the inverter, wherein the third transistor is further coupled to the second supply voltage node, and wherein the third transistor is configured to be activated responsive to the inverter driving a logic low on its output;
a fourth transistor coupled between the third transistor and the transfer node.

14. The integrated circuit as recited in claim 13, wherein the evaluation circuit further includes, a fifth transistor coupled to receive a delayed version of the output clock signal, wherein the fifth transistor is configured to be activated responsive to receiving the delayed version of the output clock signal as a logic high;
wherein a gate terminal of the fourth transistor is coupled to receive the delayed version of the output clock signal, wherein the fourth transistor is configured to be activated responsive to receiving the delayed version of the output clock signal as a logic low; and
wherein the dynamic level shifter circuit further includes a sixth transistor coupled between the transfer node and the ground node and having a gate terminal coupled to the output of the inverter, wherein the sixth transistor is configured to be activated responsive to the inverter driving its output high.

15. The integrated circuit as recited in claim 13, wherein the fourth transistor of each dynamic level shifter circuit is coupled to receive the corresponding one of the plurality of input signals, wherein the fourth transistor is configured to be activated responsive to receiving the corresponding one of the plurality of input signals as a logic low.

16. A method comprising:
a precharge circuit precharging an evaluation node of a dynamic level shifter circuit responsive to receiving a first clock signal at a logic low level on its respective gate terminal;
a pull-down circuit pulling the evaluation node to a logic low level when at least the first clock signal and an input signal are both at a logic high level;
a keeper circuit pulling the evaluation node to a logic high level when at least the evaluation node is at a logic high level; and
the dynamic level shifter circuit providing an output signal at a logic low level when the evaluation node is at the logic high level and providing the output signal at the logic high level when the evaluation node is at the logic low level;

wherein the input signal is referenced to a first supply voltage, and wherein the output signal and a signal on the evaluation node are each referenced to a second supply voltage.

17. The method as recited in claim 16, wherein the first clock signal is referenced to the second supply voltage, and wherein the method further comprises:

a static level shifter receiving a second clock signal referenced to the first supply voltage; and the static level shifter generating the first clock signal based on the second clock signal.

18. The method as recited in claim 16, further comprising activating the keeper circuit responsive to the keeper circuit receiving the input signal at the logic low level concurrent with the evaluation node being at the logic high level.

19. The method as recited in claim 16, further comprising:

activating the keeper circuit responsive to receiving a third clock signal at the logic low level concurrent with the evaluation node being at the logic high level, wherein the third clock signal is a delayed version of the first clock signal; and activating the pull-down circuit responsive to receiving the third clock signal at the logic high level concurrent with receiving the input signal and the first clock signal each at the logic high level.

20. The method as recited in claim 19, further comprising:

an inverter receiving a logic low on its input;

the inverter driving a logic high on its output responsive to receiving the logic low on its input;

activating a pull-down transistor responsive to the inverter driving a logic high on its output, the pull-down transistor being coupled between the evaluation node and a ground node and having a gate terminal coupled to the output of the inverter.

21. A dynamic level shifter comprising:

a first p-channel metal oxide semiconductor (PMOS) transistor coupled between an evaluation node and a first supply voltage node, wherein the first PMOS transistor is configured to be activated responsive to receiving a first clock signal as a logic low on a respective gate terminal;

a first inverter having an input coupled to the evaluation node;

a second PMOS transistor having a gate terminal coupled to an output of the first inverter, the second PMOS transistor being further coupled to the first supply voltage node;

a third PMOS transistor coupled between the second PMOS transistor and the evaluation node;

a first n-channel metal oxide semiconductor (NMOS) transistor coupled to a return node and having a respective gate terminal coupled to receive the first clock signal, wherein the first NMOS transistor is configured to be activated responsive to receiving the first clock signal as a logic high on its respective gate terminal; and a second NMOS transistor coupled to the evaluation node, the second NMOS transistor having a respective gate terminal coupled to receive an input signal, wherein the second NMOS transistor is configured to be activated responsive to receiving the input signal as a logic high;

wherein the first clock signal and a signal on the evaluation node are each referenced to a first supply voltage present on the first supply voltage node, and wherein the input signal is referenced to a second supply voltage having a magnitude less than the first supply voltage.

22. The dynamic level shifter as recited in claim 21, wherein the second NMOS transistor is coupled between the first NMOS transistor and the evaluation node.

23. The dynamic level shifter as recited in claim 22, wherein a gate terminal of the third PMOS transistor is coupled to receive the input signal.

24. The dynamic level shifter as recited in claim 21, further comprising a third NMOS transistor coupled between the first and second NMOS transistors, wherein a gate terminal of the third NMOS transistor is coupled to receive a second clock signal, wherein the second clock signal is a delayed version of the first clock signal, and wherein a gate terminal of the third PMOS transistor is coupled to receive the second clock signal.

25. The dynamic level shifter as recited in claim 21, further comprising a second inverter having an input coupled to the evaluation node and an output coupled to an output node.

* * * * *